United States Patent
Drost et al.

(10) Patent No.: US 8,698,322 B2
(45) Date of Patent: Apr. 15, 2014

(54) ADHESIVE-BONDED SUBSTRATES IN A MULTI-CHIP MODULE

(75) Inventors: Robert J. Drost, Los Altos, CA (US); Ashok V. Krishnamoorthy, San Diego, CA (US); John E. Cunningham, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 203 days.

(21) Appl. No.: 12/730,823

(22) Filed: Mar. 24, 2010

(65) Prior Publication Data

US 2011/0233789 A1    Sep. 29, 2011

(51) Int. Cl.
*H01L 23/538* (2006.01)

(52) U.S. Cl.
USPC ........... 257/777; 257/734; 257/746; 257/773; 257/778; 257/E23.169; 438/244; 438/108; 438/31

(58) Field of Classification Search
USPC .......... 257/777, 734, 746, 773, 778, E23.169; 438/244, 108, 31
See application file for complete search history.

(56) References Cited

U.S. PATENT DOCUMENTS

| | | | | |
|---|---|---|---|---|
| 5,210,430 A | * | 5/1993 | Taniguchi et al. | 257/103 |
| 5,225,966 A | * | 7/1993 | Basavanhally et al. | 361/774 |
| 5,659,952 A | * | 8/1997 | Kovac et al. | 29/840 |
| 5,742,006 A | * | 4/1998 | Grupp et al. | 174/525 |
| 5,903,056 A | * | 5/1999 | Canning et al. | 257/773 |
| 6,118,180 A | * | 9/2000 | Loo et al. | 257/737 |
| 6,177,719 B1 | * | 1/2001 | Huang et al. | 257/666 |
| 6,222,265 B1 | * | 4/2001 | Akram et al. | 257/723 |
| 6,791,195 B2 | * | 9/2004 | Urushima | 257/783 |
| 6,869,827 B2 | * | 3/2005 | Vaiyapuri | 438/109 |
| 6,972,964 B2 | * | 12/2005 | Ho et al. | 361/761 |
| 7,015,571 B2 | * | 3/2006 | Chang et al. | 257/686 |
| 7,077,969 B2 | * | 7/2006 | Jerominek et al. | 216/17 |
| 7,087,994 B2 | * | 8/2006 | Lee | 257/734 |
| 7,619,305 B2 | * | 11/2009 | Fan et al. | 257/686 |
| 7,754,581 B2 | * | 7/2010 | Ikeda et al. | 438/455 |
| 7,888,180 B2 | * | 2/2011 | Nogi et al. | 438/114 |
| 2008/0157327 A1 | * | 7/2008 | Yang | 257/686 |
| 2009/0039523 A1 | * | 2/2009 | Jiang et al. | 257/777 |

\* cited by examiner

*Primary Examiner* — Lex Malsawma
*Assistant Examiner* — Sheng Zhu
(74) *Attorney, Agent, or Firm* — Park, Vaughan, Fleming & Dowler LLP; Steven E. Stupp

(57) ABSTRACT

A multi-chip module (MCM) is described in which at least two substrates are mechanically coupled by an adhesive layer that maintains alignment and a zero (or near zero) spacing between proximity connectors on surfaces of the substrates, thereby facilitating high signal quality during proximity communication between the substrates. In order to provide sufficient shear strength, the adhesive layer has a thickness that is larger than the spacing. This may be accomplished using one or more positive and/or negative features on the substrates. For example, the adhesive may be bonded to: one of the surfaces and an inner surface of a channel that is recessed below the other surface; inner surfaces of channels that are recessed below both of the surfaces; or both of the surfaces. In this last case, the zero (or near zero) spacing may be achieved by disposing proximity connectors on a mesa that protrudes above at least one of the substrate surfaces.

20 Claims, 7 Drawing Sheets

╭─ 700

┌─────────────────────────────────────────────────────────────┐
│ DEPOSIT AN ADHESIVE IN OR PROXIMATE TO A POSITIVE FEATURE OR A │
│ NEGATIVE FEATURE ON ONE OR TWO SUBSTRATES IN AN *MCM,* WHERE THE │
│ POSITIVE OR NEGATIVE FEATURE ENSURES THAT A THICKNESS OF THE │
│ ADHESIVE IS DECOUPLED FROM A SPACING OF PROXIMITY CONNECTORS │
│ ON THE TWO SUBSTRATES │
│ 710 │
└─────────────────────────────────────────────────────────────┘
                              │
                              ▼
┌─────────────────────────────────────────────────────────────┐
│ CURE THE ADHESIVE, THEREBY MAINTAINING THE SPACING AND │
│ ALIGNMENT OF THE PROXIMITY CONNECTORS ON THE TWO SUBSTRATES │
│ 712 │
└─────────────────────────────────────────────────────────────┘

FIG. 7

ADHESIVE-BONDED SUBSTRATES IN A MULTI-CHIP MODULE

BACKGROUND

1. Field

The present disclosure generally relates to multi-chip modules (MCMs) and techniques for fabricating MCMs. More specifically, the present disclosure relates to an MCM that includes substrates that are bonded to each other using an adhesive.

2. Related Art

Multi-chip modules (MCMs) are being developed to facilitate proximity communication (such as capacitively coupled communication) between multiple integrated circuits (ICs) for the next generation of high-performance computers. In these MCMs, adjacent chips are often positioned face-to-face so that information can be communicated between proximity connectors (such as metal pads) on surfaces of facing chips. To facilitate ultrafast chip-to-chip communications via capacitive coupling between the proximity connectors, these chips need to be accurately positioned so that the proximity connectors are horizontally aligned on a micrometer scale, with a gap or spacing of a few microns or less between the proximity connectors on the facing chips.

A simple and elegant technique for assembling the chips in an MCM involves the use of an adhesive to bond the chips together to maintain the desired horizontal and vertical alignment between the proximity connectors. However, there is a tradeoff between the strength of the adhesive layer between a pair of chips and the signal quality during proximity communication. In particular, if the adhesive layer or bondline is thick (e.g., a thickness of 10 μm or more), the adhesive layer is ductile, but this increases the spacing between the proximity connectors, which significantly decreases the signal coupling and the signal quality. Alternatively, if a thin adhesive layer is used, the signal coupling and signal quality are improved, but the adhesive layer is susceptible to shearing failure under lateral stress and strain, which decreases the reliability of the MCM.

Hence, what is needed are an MCM and an associated fabrication technique that do not suffer from the above-described problems.

SUMMARY

One embodiment of the present disclosure provides a multi-chip module (MCM) that includes: a first substrate having a first surface, where first proximity connectors are disposed on the first surface; and a second substrate having a second surface that faces the first surface, where second proximity connectors are disposed on the second surface. The first proximity connectors and the second proximity connectors are separated by a spacing, and the second surface includes a channel having an inner surface that is recessed below the second surface. Furthermore, an adhesive, which is mechanically coupled to the first substrate and the inner surface, and which has a thickness that is larger than the spacing, maintains alignment and provides shear strength in the MCM, thereby facilitating proximity communication of signals between the first proximity connectors and the second proximity connectors.

This adhesive may be air cured, thermally cured, pressure cured or optically cured. For example, the adhesive may include epoxy glue.

Moreover, the channel may extend to at least an edge of the second substrate that is approximately perpendicular to the second surface, thereby defining an opening in the edge into which the adhesive is deposited during assembly of the MCM. In some embodiments, the first surface includes another channel having another inner surface that is recessed below the first surface, and the adhesive may be mechanically coupled to the first substrate via the other inner surface.

In some embodiments, the spacing is less than 5 μm. Furthermore, the thickness may be greater than 5 μm and/or may be less than 200 μm.

Note that the proximity communication may include: electrical proximity communication, inductive proximity communication, conductive proximity communication, and/or optical proximity communication.

In another embodiment of the MCM, in addition to or instead of the channel, the second surface includes a mesa having a third surface that protrudes above the second surface, and the second proximity connectors are disposed on the third surface. In this embodiment, the adhesive is mechanically coupled to the first surface and the second surface.

Another embodiment provides a system that includes the MCM.

Another embodiment provides a method for fabricating the MCM. During the method, the first surface and the second surface are mechanically coupled using the adhesive.

BRIEF DESCRIPTION OF THE FIGURES

FIG. 7 is a flow chart illustrating a process for fabricating an MCM in accordance with an embodiment of the present disclosure.

Note that like reference numerals refer to corresponding parts throughout the drawings. Moreover, multiple instances of the same type of part are designated by a common prefix separated from an instance number by a dash.

DETAILED DESCRIPTION

Embodiments of a multi-chip module (MCM), a system that includes the MCM, and a technique for fabricating the MCM are described. This MCM includes at least two substrates that are mechanically coupled by an adhesive layer that maintains alignment and a zero (or near zero) spacing between proximity connectors on surfaces of the substrates, thereby facilitating high signal quality during proximity communication between the substrates. In order to provide sufficient shear strength, the adhesive layer has a thickness that is larger than the spacing. This may be accomplished using one or more positive and/or negative features on the substrates. For example, the adhesive may be bonded to: one of the surfaces and an inner surface of a channel that is recessed below the other surface; inner surfaces of channels that are recessed below both of the surfaces; or both of the surfaces. In this last case, the zero (or near zero) spacing may be achieved by disposing proximity connectors on a mesa that protrudes above at least one of the substrate surfaces.

By maintaining the alignment, and providing a zero (or near zero) spacing and sufficient shear strength, this fabrication technique may provide a reliable MCM with high signal quality. Furthermore, the fabrication technique may be compatible with high-volume manufacturing. For example, the channel(s) and/or the mesa may be fabricated on the surfaces using semiconductor-process techniques, and the resulting substrates may be assembled in the MCM using low-cost, high-yield pick-and-place assembly equipment. Consequently, the fabrication technique may reduce the cost and complexity of the MCM.

Figure 1:
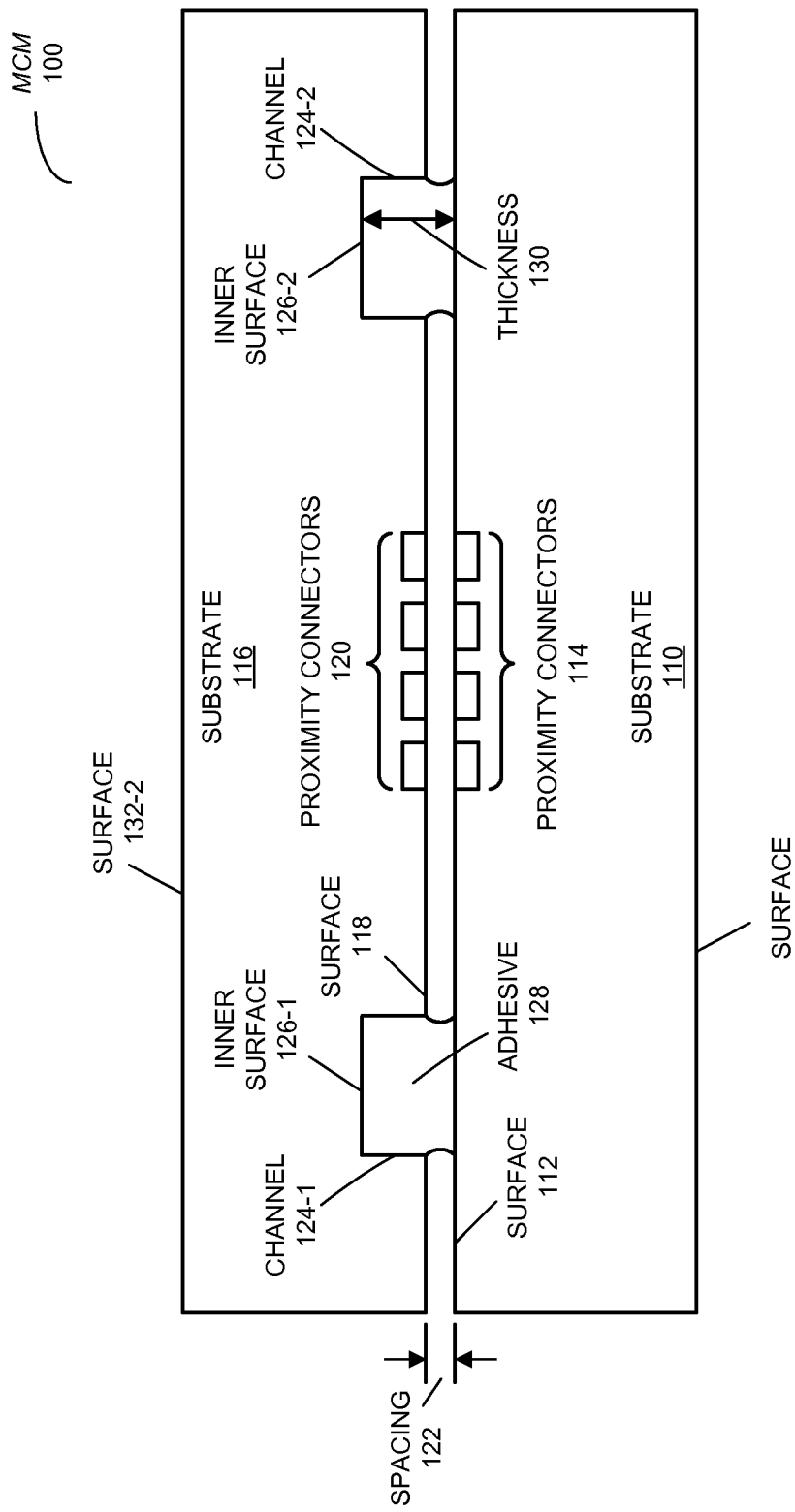
FIG. 1 is a block diagram illustrating a multi-chip module (MCM) in accordance with an embodiment of the present disclosure.

We now describe embodiments of the MCM. FIG. 1 presents a block diagram illustrating an MCM 100 that includes: a substrate 110 having a surface 112, where proximity connectors 114 are disposed on surface 112; and a substrate 116 having a surface 118 that faces surface 112, where proximity connectors 120 are disposed on surface 118. Note that proximity connectors 114 and proximity connectors 120 are separated by a spacing 122, and surface 118 includes at least one channel, such as channel 124-1 (which may be an etch pit, and more generally a negative feature), having an inner surface (such as inner surface 126-1) that is recessed below surface 118. Furthermore, an adhesive 128, which is mechanically coupled to substrate 110 and one or more inner surfaces (such as inner surface 126-1), has a bondline thickness 130 that is larger than spacing 122, maintains alignment and provides shear strength in MCM 100, thereby facilitating proximity communication with high signal integrity between proximity connectors 114 and proximity connectors 120.

Note that the configuration in MCM 100 decouples spacing 122 and thickness 130. For example, spacing 122 may be between 0-5 μm, while thickness 130 may be between 5-200 μm. Thus, the depth of a channel (such as channel 124-1) may increase bondline thickness 130 in MCM 100 by up to 40×, while leaving spacing 122 unchanged.

A wide variety of adhesives may be used to mechanically couple substrate 110 and substrate 116. For example, adhesive 128 may include epoxy glue or a silicon-based adhesive. Moreover, adhesive 128 may be: air cured, thermally cured, pressure cured and/or optically cured (for example, using ultra-violet light).

Wicking of adhesive 128 into a channel (such as channel 124-1) and thickness 130 may be determined by: the adhesive viscosity, the surface tension of adhesive 128, and the pressure applied to external surfaces 132 of substrates 110 and 116 during assembly. For example, the viscosity may be 200 cps.

Figure 2:
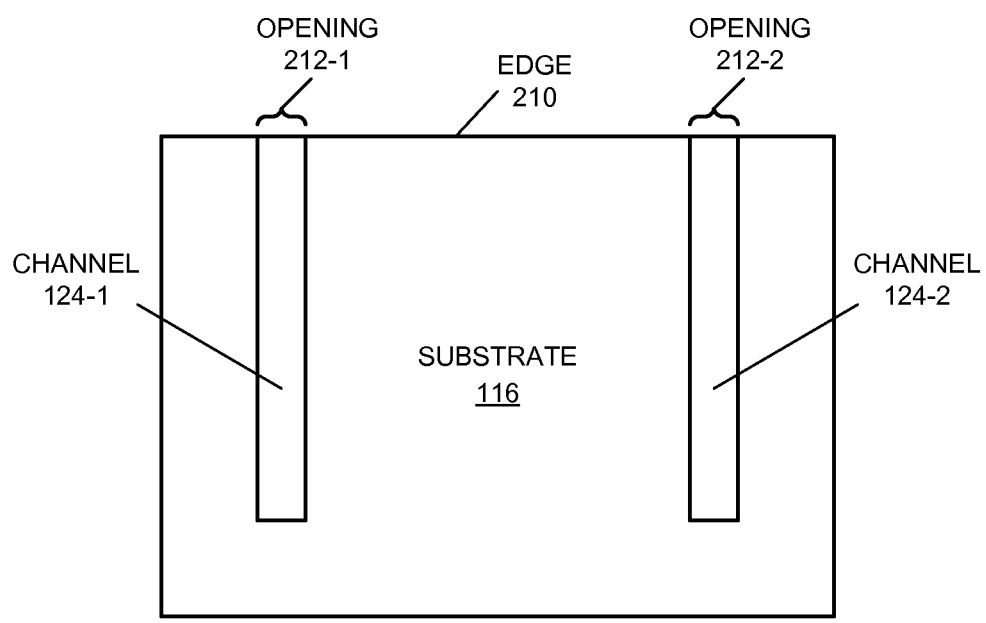
FIG. 2 is a block diagram illustrating a top view of a substrate having a channel in accordance with an embodiment of the present disclosure.

As shown in FIG. 2, which presents a block diagram illustrating a top view of substrate 116, to facilitate assembly of MCM 100, the one or more channels (such as channel 124-1) in substrate 116, which capture and guide adhesive 128, may extend to at least an edge 210 of substrate 116 that is approximately perpendicular to surface 118, thereby defining one or more openings (such as opening 212-1) in edge 210 into which adhesive 128 is deposited during assembly of MCM 100. For example, surfaces 112 and 118 of substrates 110 and 116 may be aligned and pressed together to achieve a desired spacing 122. Then, adhesive 128 may be injected into openings 212, and subsequently cured to bond substrates 110 and 116 to each other. Note that this single process operation is compatible with existing fabrication techniques and, thus, may facilitate low-cost, high-yield fabrication of MCM 100.

Figure 3:
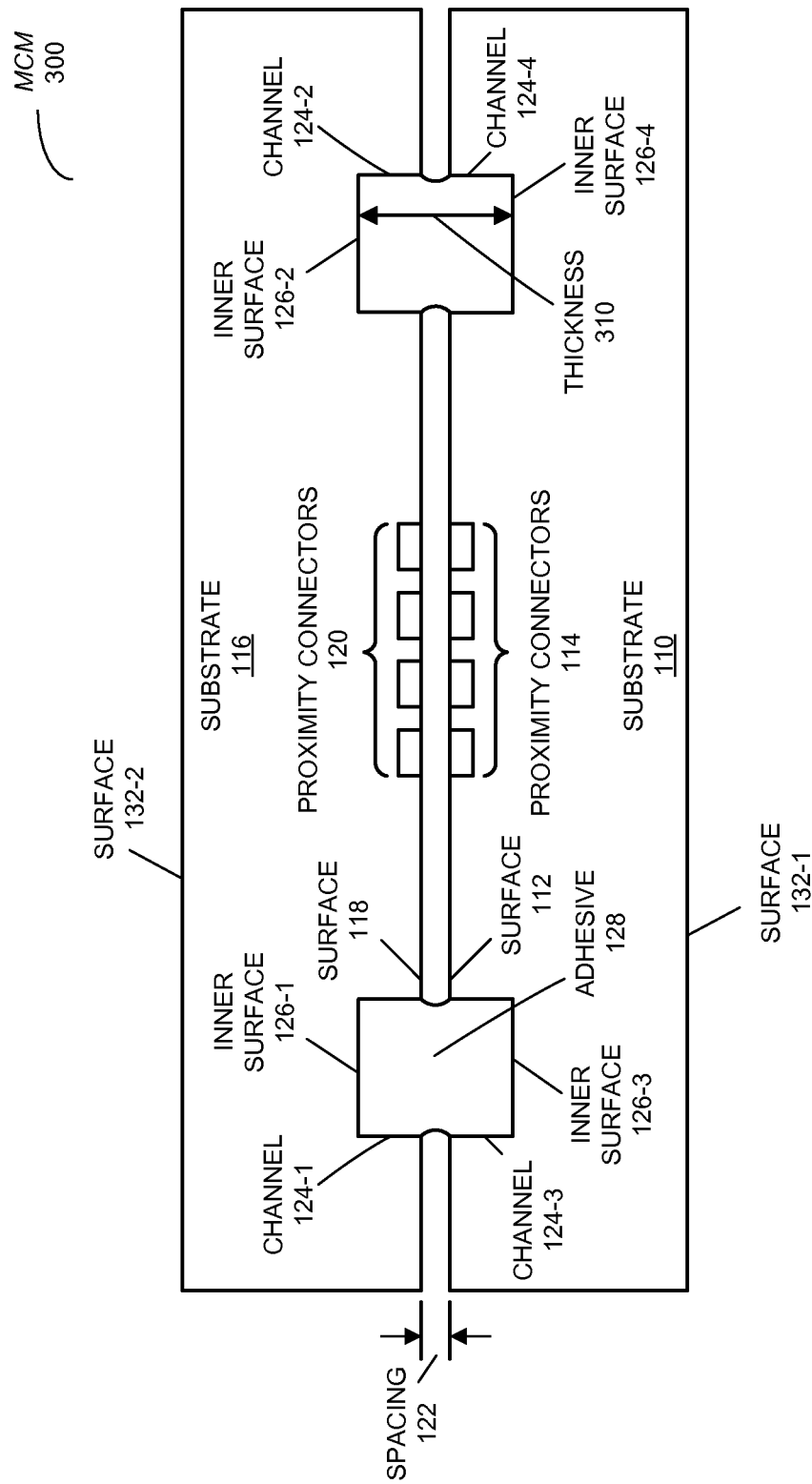
FIG. 3 is a block diagram illustrating an MCM in accordance with an embodiment of the present disclosure.

While MCM 100 illustrates the use of a single channel (such as channel 124-1) in each adhesive bondline, a variety of configurations that include positive and/or negative features may be used to decouple spacing 122 and thickness 130. For example, as shown in FIG. 3, which presents a block diagram illustrating an MCM 300, surface 112 may also include one or more channels (such as channel 124-3) having inner surfaces (such as inner surface 126-3) that are recessed below surface 112. In this embodiment, adhesive 128 is mechanically coupled to inner surfaces in a pair of channels (such as channels 124-1 and 124-3), which may double thickness 310 relative to thickness 130 in FIG. 1.

Figure 4:
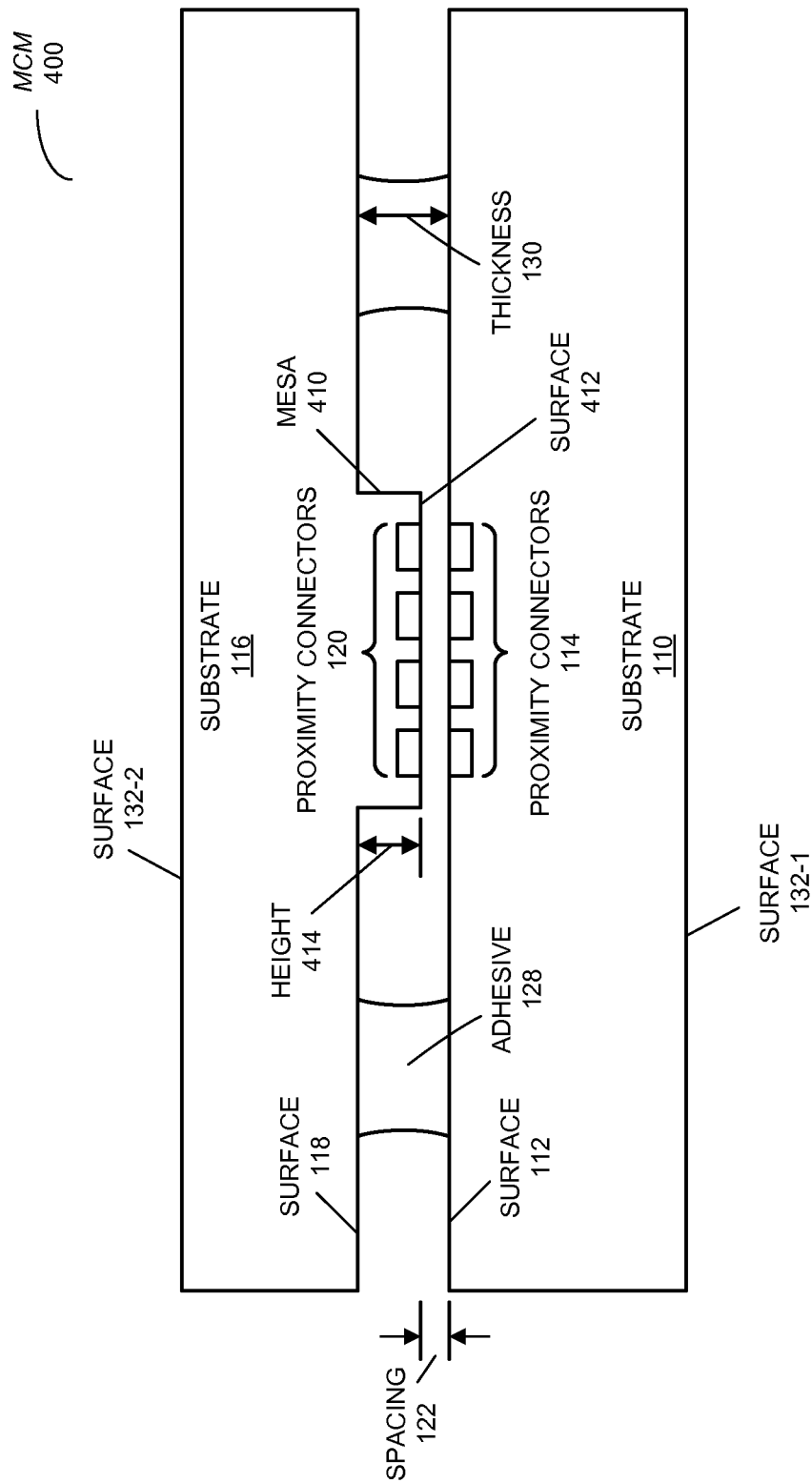
FIG. 4 is a block diagram illustrating an MCM in accordance with an embodiment of the present disclosure.

Alternatively or additionally, a positive feature may be used to decouple spacing 122 and thickness 130. For example, as shown in FIG. 4, which presents a block diagram illustrating an MCM 400, a mesa 410 having a surface 412 may protrude a height 414 above surface 118, where proximity connectors 120 are disposed on surface 412. In this embodiment, adhesive 128 mechanically couples surface 112 and surface 118, while height 414 ensures that spacing 122 is less than thickness 130.

Figure 5:
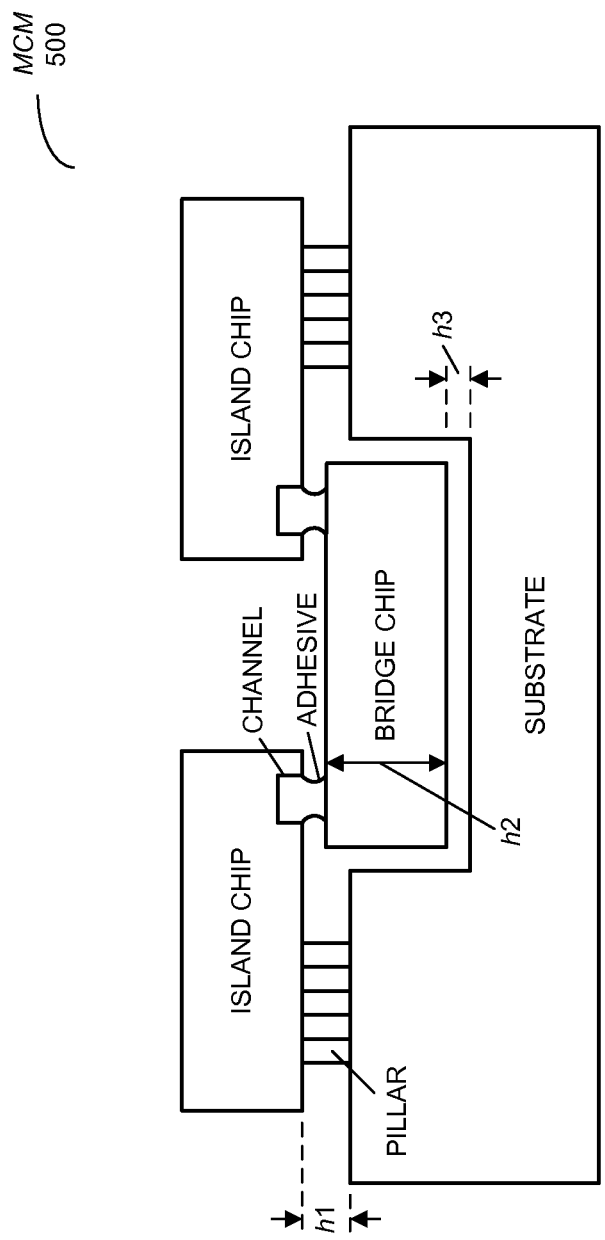
FIG. 5 is a block diagram illustrating an MCM in accordance with an embodiment of the present disclosure.

In some embodiments, the substrates in the MCM include island chips (such as processors) and bridge chips, which couple signals between island chips. For example, as shown in FIG. 5, which presents a block diagram illustrating an MCM 500, the island chips may be face-down and a bridge chip may be placed face-up. (Alternatively, in a flip-chip configuration the island chips may be face-up and the bridge chip may be face-down.) Note that the island and bridge chips receive signals, power and ground from the package substrate through C4 solder and/or copper pillars as level-one interconnects, and that the bridge chip communicates with the island chips using proximity communication. Moreover, in addition to maintaining the alignment of the proximity connectors (not shown) between the island chips and the bridge chip, the adhesive may keep the island chip from falling down (i.e., it may keep the spacing between the proximity connectors on the adjacent chips small). Thus, given a thickness h2 of the bridge chip, the adhesive may help maintain the mechanical clearances, h1 and h3, between the components in MCM 500.

Figure 6:
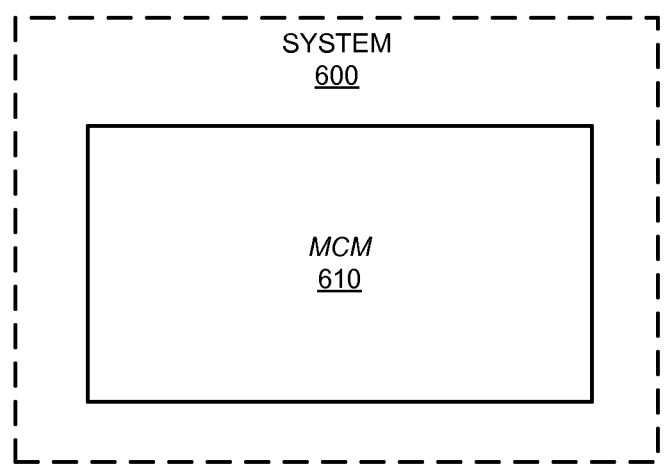
FIG. 6 is a block diagram illustrating a system in accordance with an embodiment of the present disclosure.

One or more of the preceding embodiments of the MCM may be included in a system and/or an electronic device. This is shown in FIG. 6, which presents a block diagram illustrating a system 600 that includes MCM 610. In general, an MCM may include an array of chip modules (CMs) or single-chip modules (SCMs), and a given SCM may include at least one substrate, such as a semiconductor die. Note that an MCM is sometimes referred to as a 'macro-chip.' Furthermore, the substrate may communicate with other substrates, CMs and/or SCMs in the MCM using proximity communication of electromagnetically coupled signals (which is referred to as 'electromagnetic proximity communication'). For example, the proximity communication may include: communication of capacitively coupled signals ('electrical proximity communication') and/or communication of optical signals (such as 'optical proximity communication'). In some embodiments, the electromagnetic proximity communication includes inductively coupled signals and/or conductively coupled signals.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple-core processor computer systems). For example, the MCM may be included in a backplane that is coupled to multiple processor blades, or the MCM may couple different types of components (such as processors, memory, input/output devices, and/or peripheral devices). In some embodiments, the MCM performs the functions of: a switch, a hub, a bridge, and/or a router.

Note that system 600 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

MCMs in FIGS. 1 and 3-5 and/or system 600 in FIG. 6 may include fewer components or additional components. For example, a given MCM may include one or more negative features (such as channels 124 in FIGS. 1 and 3) and/or one or more positive features (such as mesa 410 in FIG. 4). Moreover, in some embodiments channels 124 in FIGS. 1-3 may not extend to the edges of the substrates (for example, they may be rectangular or square etch pits). Furthermore, a negative feature may be defined in one or more layers that are deposited on a surface of a substrate, and the negative features may be recessed below a surface of the top layer deposited on the substrate. Similarly, a positive feature may protrude above a local surface, which may be the same as or different from a top layer deposited on the substrate. Thus, in the preceding embodiments a surface of a substrate should be understood to include a surface of a layer deposited on the substrate or a surface of the substrate itself.

Note that a given positive or negative feature may be fabricated using an additive process (in which material is deposited or added to a substrate) or a subtractive process (in which material is removed from a substrate). For example, the process may include: plating, sputtering, isotropic etching, anisotropic etching, a photolithographic technique and/or a direct-write technique. Furthermore, these features may be fabricated using a wide variety of materials (such as: a semiconductor, metal, glass, sapphire, and/or silicon dioxide) and/or may have a wide variety of shapes (such as a groove, a trapezoid, a rectangular shape, a half hemisphere, etc.).

Although these embodiments are illustrated as having a number of discrete items, the MCM and the system are intended to be functional descriptions of the various features that may be present rather than structural schematics of the embodiments described herein. Consequently, in these embodiments two or more components may be combined into a single component, and/or a position of one or more components may be changed.

We now describe embodiments of a process. FIG. 7 presents a flow chart illustrating a process 700 for fabricating an MCM. During the process, an adhesive is deposited in or proximate to a positive or negative feature on one or two substrates in the MCM (operation 710), where the positive or negative feature ensures that a thickness of the adhesive is decoupled from a spacing of proximity connectors on the two substrates. Then, the adhesive is cured (operation 712), thereby maintaining the spacing and alignment of the proximity connectors on the two substrates.

In some embodiments of process 700, there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A multi-chip module (MCM), comprising:
a first substrate having a first surface, wherein a first set of proximity connectors are disposed on the first surface;
a second substrate having a second surface that faces the first surface, wherein a second set of proximity connectors are disposed on the second surface, wherein the first set of proximity connectors and the second set of proximity connectors are separated by a spacing, wherein the second surface includes a channel that is defined by an opening in the second substrate along the second surface, wherein the channel comprises an inner surface that faces the first surface and is recessed in the second substrate away from the second surface, and wherein the channel extends to an edge of the second substrate that is perpendicular to the second surface; and
an adhesive, mechanically coupled to the first substrate and the inner surface, having a thickness that is larger than the spacing, thereby maintaining alignment and providing shear strength in the MCM, the adhesive configured so that at least the spacing between the first and second surfaces in an area where the first and second sets of proximity connectors are located is free of adhesive.

2. The MCM of claim 1, wherein the adhesive is one or more of, air cured, thermally cured, pressure cured and optically cured.

3. The MCM of claim 1, wherein the channel extends to at least an edge of the second substrate that is approximately perpendicular to the second surface, thereby defining an opening in the edge into which the adhesive is deposited during assembly of the MCM.

4. The MCM of claim 1, wherein the proximity communication includes at least one of, electrical proximity communication, inductive proximity communication, conductive proximity communication and optical proximity communication.

5. The MCM of claim 1, wherein the first surface includes another channel having another inner surface that is recessed below the first surface; and
wherein the adhesive is mechanically coupled to the first substrate via the other inner surface.

6. The MCM of claim 1, wherein the channel is enclosed by only three sides, wherein the three sides comprise the inner surface and two sides perpendicular to the second surface.

7. The MCM of claim 1, wherein the first substrate comprises a first semiconductive material and the second substrate comprises a second semiconductive material.

8. The MCM of claim 1, wherein the first substrate comprises a first semiconductor die and wherein the second substrate comprises a second semiconductor die.

9. An MCM, comprising:
a first substrate having a first surface, wherein a first set of proximity connectors are disposed on the first surface;
a second substrate having a second surface that faces the first surface, wherein a mesa having a third surface protrudes above the second surface, wherein the mesa is between edges of the second substrate that are perpendicular to the second surface, wherein the mesa comprises at least one of a semiconductive and an electrically insulating material, wherein a second set of proximity connectors are disposed on the third surface, and wherein the first set of proximity connectors and the second set of proximity connectors are separated by a spacing; and an adhesive, mechanically coupled to the first surface and the second surface and bonded to the first surface and the second surface, having a thickness that is larger than the spacing, thereby maintaining alignment and providing shear strength in the MCM, the adhesive configured so that at least the spacing between the first and second surfaces in an area where the first and second sets of proximity connectors are located is free of adhesive, wherein the adhesive is not in contact with the mesa.

10. The MCM of claim 9, wherein the adhesive is one or more of, air cured, thermally cured, pressure cured and optically cured.

11. The MCM of claim 9, wherein the spacing is less than 5 µm.

12. The MCM of claim 9, wherein the thickness is greater than 5 µm and less than 200 µm.

13. The MCM of claim 9, wherein the proximity communication includes one or more of, electrical proximity communication, inductive proximity communication, conductive proximity communication and optical proximity communication.

14. The MCM of claim 9, wherein the mesa has edges that are perpendicular to the third surface, and wherein each edge for the mesa is between the edges of the second substrate that are perpendicular to the second surface.

15. The MCM of claim 9, wherein the mesa is an extension of the second substrate, and wherein the second substrate comprises the at least one of the semiconductive and the electrically insulating material.

16. A system, comprising an MCM, wherein the MCM includes:

a first substrate having a first surface, wherein first proximity connectors are disposed on the first surface;

a second substrate having a second surface that faces the first surface, wherein a second set of proximity connectors are disposed on the second surface, wherein the first set of proximity connectors and the second set of proximity connectors are separated by a spacing, wherein the second surface includes a channel that is defined by an opening in the second substrate along the second surface, wherein the channel comprises an inner surface that faces the first surface and is recessed in the second substrate away from the second surface, and wherein the channel extends to an edge of the second substrate that is perpendicular to the second surface; and an adhesive, mechanically coupled to the first substrate and the inner surface, having a thickness that is larger than the spacing, thereby maintaining alignment and providing shear strength in the MCM, the adhesive configured so that at least the spacing between the first and second surfaces in an area where the first and second sets of proximity connectors are located is free of adhesive.

17. The system of claim 16, wherein the adhesive is one or more of air cured, thermally cured, pressure cured and optically cured.

18. The system of claim 16, wherein the channel extends to at least an edge of the second substrate that is approximately perpendicular to the second surface, thereby defining an opening in the edge into which the adhesive is deposited during assembly of the MCM.

19. The system of claim 16, wherein the proximity communication includes one or more of electrical proximity communication, inductive proximity communication, conductive proximity communication and optical proximity communication.

20. The system of claim 16, wherein the first surface includes another channel having another inner surface that is recessed below the first surface; and wherein the adhesive is mechanically coupled to the first substrate via the other inner surface.

* * * * *